(12) United States Patent
Lee et al.

(10) Patent No.: US 9,611,415 B2
(45) Date of Patent: Apr. 4, 2017

(54) COMPOSITE HEAT-DISSIPATION SUBSTRATE AND MANUFACTURING METHOD OF THE SAME

(71) Applicant: KOREA INSTITUTE OF MACHINERY & MATERIALS, Daejeon (KR)

(72) Inventors: Sang-Kwan Lee, Changwon-si (KR); Sang-Bok Lee, Gimhae-si (KR); Jung-Yeul Yun, Changwon-si (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 134 days.

(21) Appl. No.: 14/553,161

(22) Filed: Nov. 25, 2014

(65) Prior Publication Data

US 2015/0079374 A1    Mar. 19, 2015

Related U.S. Application Data

(62) Division of application No. 13/726,378, filed on Dec. 24, 2012, now Pat. No. 8,920,707.

(30) Foreign Application Priority Data

Feb. 20, 2012  (KR) .......................... 10-2012-0017080

(51) Int. Cl.
  *C09K 5/14*  (2006.01)
  *F28F 21/04*  (2006.01)
  (Continued)

(52) U.S. Cl.
  CPC ................ *C09K 5/14* (2013.01); *B22F 7/062* (2013.01); *B29C 67/04* (2013.01); *B32B 5/16* (2013.01); *B32B 5/18* (2013.01); *B32B 7/04* (2013.01); *B32B 9/005* (2013.01); *B32B 9/041* (2013.01); *B32B 15/04* (2013.01); *B32B 18/00* (2013.01); *C04B 35/645* (2013.01);
  (Continued)

(58) Field of Classification Search
  CPC ............ C04B 41/88; B28B 21/94; C09K 5/14
  USPC ....................................................... 264/643
  See application file for complete search history.

(56) References Cited

U.S. PATENT DOCUMENTS 4,943,413 A    7/1990  Tank
5,167,271 A   12/1992  Lange et al.
(Continued)

FOREIGN PATENT DOCUMENTS

JP    2001105124 A    4/2001
JP    2003327480 A   11/2003
(Continued)

*Primary Examiner* — Jason L Lazorcik
*Assistant Examiner* — Russell Kemmerle, III
(74) *Attorney, Agent, or Firm* — Hauptman Ham, LLP

(57) ABSTRACT

The present disclosure provides a composite heat-dissipation substrate and a method of manufacturing the same. The composite heat-dissipation substrate includes a first ceramic layer having insulating properties, a second porous ceramic layer and a metal layer, wherein the first ceramic layer and the second ceramic layer are continuously connected to each other so as not to form an interface therebetween, and the metal layer is infiltrated into plural pores of the second ceramic layer to be coupled to the ceramic layers, whereby interfacial coupling force between the ceramic layers and the metal layer is very high, thereby providing significantly improved heat dissipation characteristics.

13 Claims, 9 Drawing Sheets

(51) Int. Cl.
    *B29C 67/04*     (2017.01)
    *B32B 18/00*     (2006.01)
    *C04B 41/88*     (2006.01)
    *C04B 41/00*     (2006.01)
    *C04B 41/45*     (2006.01)
    *H01L 23/373*     (2006.01)
    *B22F 7/06*     (2006.01)
    *C22C 32/00*     (2006.01)
    *C04B 35/645*     (2006.01)
    *F21V 29/85*     (2015.01)
    *F21V 29/89*     (2015.01)
    *B32B 5/18*     (2006.01)
    *B32B 15/04*     (2006.01)
    *B32B 5/16*     (2006.01)
    *B32B 7/04*     (2006.01)
    *B32B 9/00*     (2006.01)
    *B32B 9/04*     (2006.01)
    *F28F 21/08*     (2006.01)
    *F28F 13/00*     (2006.01)
    *H01L 33/64*     (2010.01)
    *C04B 111/00*     (2006.01)

(52) U.S. Cl.
    CPC ........ *C04B 41/009* (2013.01); *C04B 41/4523* (2013.01); *C04B 41/88* (2013.01); *C22C 32/0005* (2013.01); *C22C 32/0021* (2013.01); *C22C 32/0036* (2013.01); *C22C 32/0047* (2013.01); *C22C 32/0052* (2013.01); *C22C 32/0068* (2013.01); *F21V 29/86* (2015.01); *F21V 29/89* (2015.01); *F28F 21/04* (2013.01); *H01L 23/3731* (2013.01); *H01L 23/3733* (2013.01); *B32B 2250/03* (2013.01); *B32B 2264/107* (2013.01); *B32B 2307/302* (2013.01); *C04B 2111/00844* (2013.01); *C04B 2237/34* (2013.01); *C04B 2237/341* (2013.01); *C04B 2237/343* (2013.01); *C04B 2237/36* (2013.01); *C04B 2237/361* (2013.01); *C04B 2237/365* (2013.01); *C04B 2237/366* (2013.01); *C04B 2237/368* (2013.01); *C04B 2237/586* (2013.01); *C04B 2237/704* (2013.01); *F28F 13/003* (2013.01); *F28F 21/08* (2013.01); *H01L 33/642* (2013.01); *H01L 2924/0002* (2013.01); *Y10T 428/24992* (2015.01); *Y10T 428/249957* (2015.04)

(56) References Cited

U.S. PATENT DOCUMENTS

| | | |
|---|---|---|
| 5,561,321 A | 10/1996 | Hirano et al. |
| 7,141,309 B2 | 11/2006 | Kinoshita et al. |
| 8,043,694 B2 | 10/2011 | His et al. |
| 2009/0014925 A1 | 1/2009 | Noguchi et al. |
| 2009/0197074 A1 | 8/2009 | Fujita et al. |
| 2012/0165179 A1 | 6/2012 | Reilly et al. |

FOREIGN PATENT DOCUMENTS

| | | |
|---|---|---|
| JP | 2005145746 A | 6/2005 |
| WO | 2005068398 A1 | 7/2005 |

COMPOSITE HEAT-DISSIPATION SUBSTRATE AND MANUFACTURING METHOD OF THE SAME

CROSS-REFERENCE TO RELATED APPLICATION

The present application is a Divisional Application of U.S. Ser. No. 13/726,378 filed Dec. 24, 2012, which claims the benefit under 35 U.S.C. §119 of Korean Patent Application No. 10-2012-0017080 filed on Feb. 20, 2012 in the Korean Intellectual Property Office, the entirety of which disclosure is incorporated herein by reference.

BACKGROUND

1. Technical Field

The present invention relates to a composite heat-dissipation substrate and a method of manufacturing the same. More particularly, the present invention relates to a composite heat-dissipation substrate, which includes a first ceramic layer having insulating properties, a second porous ceramic layer and a metal layer, wherein the first ceramic layer and the second ceramic layer are continuously connected to each other so as not to form an interface therebetween, and the metal layer is infiltrated into plural pores of the second ceramic layer to be coupled to the ceramic layers, whereby interfacial coupling force between the ceramic layers and the metal layer are very high, thereby providing significantly improved heat dissipation characteristics. The present invention also relates to a method of manufacturing the same.

2. Description of the Related Art

Recently, with various merits including high brightness, low power consumption, long lifespan, emission of various colors, eco-friendliness, and the like, light emitting devices (LEDs) have attracted much attention in various fields including backlight units for flat panel displays (FPD), indoor/outdoor lighting, vehicle headlamps, display devices of medical, interior business and electronic communication apparatuses, and the like.

However, regardless of such merits, the LED still has a problem of low heat dissipation due to high junction temperature in an LED module.

High junction temperature in the LED module inevitably leads to high energy consumption and rapid deterioration in luminous efficacy of the LED, thereby causing significant deterioration of reliability.

Thus, in order to solve low heat dissipation of the LED module, various studies have been conducted to develop various types of substrates using metallic materials having high thermal conductivity.

In a conventional heat dissipation structure of the LED module, heat is transferred to a connection part on a circuit board through a heat sink placed within a housing and is then transferred to a metal plate, such as an iron plate, which has good thermal conductivity and is placed under the circuit board, such that the heat can be dissipated to the outside through a wide area of the back side of the metal plate.

Since such a structure employs a metallic material having good thermal conductivity, it is possible to reduce the quantity of heat generated per unit area by allowing heat generated in a region having a high density of LED modules to be rapidly conducted and diffused towards a front side of the metal plate. However, due to difficulty in improving the thermal conductivity of existing highly conductive metal, and limited heat dissipation performance of a lens covering an LED, a heat sink placed under the LED, a sealing package and a coated layer on a circuit board, there are various problems in reduction of the quantity of heat generated per unit area.

To solve such problems, many documents, such as Korean Patent Publication No 10-2008-0079745A and the like, disclose various heat dissipation structures, but do not provide a technique for improving heat dissipation through improvement of interfacial coupling force between a ceramic layer and a metal layer.

BRIEF SUMMARY

The present invention is conceived to solve such problems in the art, and an aspect of the present invention is to provide a composite heat-dissipation substrate, which includes a first ceramic layer having insulating properties, a second porous ceramic layer and a metal layer, wherein the first ceramic layer and the second ceramic layer are continuously connected to each other so as not to form an interface therebetween, and the metal layer is infiltrated into plural pores of the second ceramic layer to be coupled to the ceramic layers, whereby interfacial coupling force between the ceramic layers and the metal layer are very high, thereby providing significantly improved heat dissipation characteristics Another aspect of the present invention is to provide a method of manufacturing the same.

In accordance with one aspect, the present invention provides a composite heat-dissipation substrate, which includes: a first ceramic layer having insulating properties; a second porous ceramic layer; and a metal layer, wherein the first ceramic layer and the second ceramic layer are continuously connected to each other so as not to form an interface therebetween, and the metal layer is infiltrated into plural pores of the second ceramic layer to be coupled to the ceramic layers.

In accordance with another aspect, the present invention provides a method for manufacturing a composite heat-dissipation substrate, which includes: i) preparing a first ceramic powder having insulating properties; ii) stacking a powder mixture of a second ceramic powder and a pore forming material on the first ceramic powder; iii) forming a porous ceramic structure by evaporating the pore forming material and sintering the first ceramic powder and the powder mixture; and iv) squeeze-infiltrating a molten metal into plural pores formed in the porous ceramic structure to be impregnated into the porous ceramic structure.

According to the present invention, the composite heat-dissipation substrate has very high interfacial coupling force between the ceramic layers and the metal layer, thereby remarkably improving heat dissipation.

In addition, in the method of manufacturing a composite heat-dissipation substrate according to the present invention, the first ceramic layer and the second ceramic layer are continuously connected to each other so as not to for an interface therebetween, and the metal layer is infiltrated into pores of the second porous ceramic layer to be coupled to the ceramic layers, whereby interfacial coupling force between the ceramic layers and the metal layer are very high, thereby providing significantly improved heat dissipation characteristics.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Figure 1:
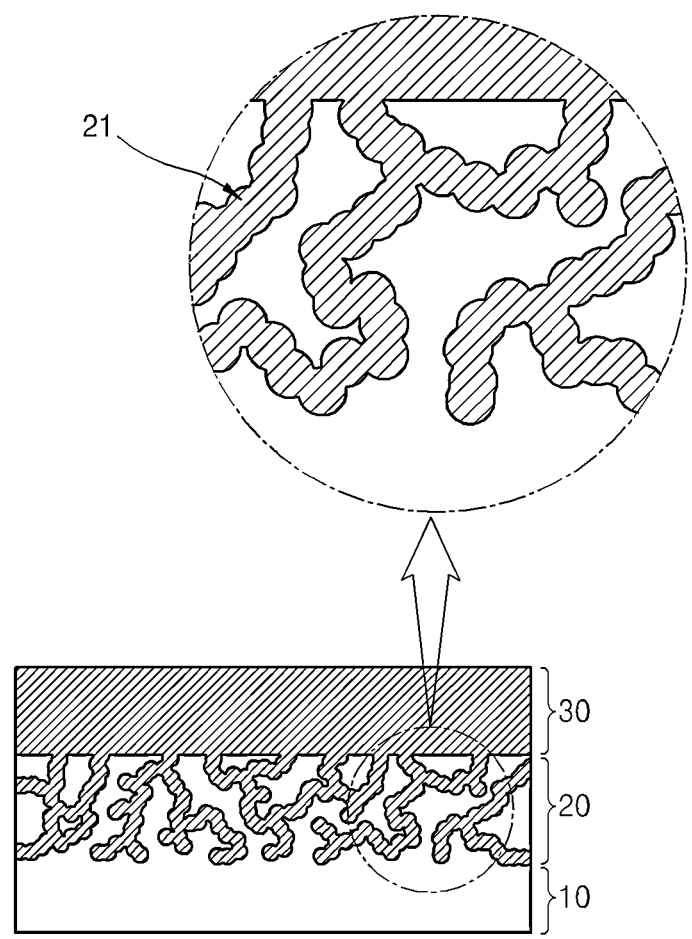
FIG. 1 is a diagram of a composite heat-dissipation substrate in accordance with one embodiment of the present invention.

Exemplary embodiments of the present invention will now be described in detail with reference to the accompanying drawings. However, it should be understood that the present invention is not limited to the following embodiments and may be embodied in different ways, and that the embodiments are provided for complete disclosure and thorough understanding of the invention by those skilled in the art. The scope of the invention is defined only by the claims. The same components will be denoted by the same reference numerals throughout the drawings. Details apparent to those skilled in the art will be omitted herein.

Composite Heat-Dissipation Substrate

A composite heat-dissipation substrate according to one embodiment of the invention includes: a first ceramic layer having insulating properties; a second porous ceramic layer; and a metal layer, wherein the first ceramic layer and the second ceramic layer are continuously connected to each other so as not to form an interface therebetween, and the metal layer is infiltrated into plural pores of the second ceramic layer to be coupled to the ceramic layers.

Referring to FIG. 1, the composite heat-dissipation substrate includes a first ceramic layer 10 having insulating properties and a second porous ceramic layer 20. Here, it should be noted that the first ceramic layer 10 and the second ceramic layer 20 are defined for convenience of description, and that the first ceramic layer 10 and the second ceramic layer 20 are substantially continuously connected to each other so as not to form an interface therebetween.

Here, the first ceramic layer 10 is distinguished from the second ceramic layer 20 in terms of density. That is, since the second ceramic layer 20 is a porous layer, the first ceramic layer 10 has a higher density than the second ceramic layer 20, and a density difference therebetween may range from 0.1 $g/cm^3$ to 3 $g/cm^3$.

If the density difference between the first ceramic layer 10 and the second ceramic layer 20 is not within this range, it is difficult to infiltrate molten metal into the pores. That is, a small amount of molten metal is infiltrated into the pores, thereby making it difficult to achieve improvement of interfacial coupling force and thermal conductivity. If the density difference is beyond this range, it is difficult to achieve a uniform porous ceramic structure.

Since most heat is dissipated through the metal layer 30 coupled to the ceramic layers, the first and second ceramic layers 10 and 20 require high heat dissipation characteristics.

Thus, the first and second ceramic layers 10, 20 may be comprised of a ceramic material having a thermal conductivity of 1 W/m·K or more at room temperature.

In addition, the first and second ceramic layers 10, 20 may have a coefficient of thermal expansion of $12 \times 10^{-6}$ or less and an insulation resistance of $10^5$ Ωcm or more.

If the thermal conductivity of the ceramic material for the first and second ceramic layers is below this range, it is difficult to achieve sufficient dissipation of heat generated from the light emitting device. In particular, a high output LED requiring a large amount of electric current for operation can undergo deterioration in luminous efficacy and lifespan due to increase in temperature therein. On the other hand, although the present invention does not define an upper limit of thermal conductivity of the ceramic material, the use of a ceramic material having an excessively high thermal conductivity can provide a problem of excessive increase of material costs.

In some embodiments, the ceramic material for the first and second ceramic layers 10, 20 may include at least one selected from carbides such as SiC, $B_4C$, and the like, oxides such as $Al_2O_3$, MgO, $SiO_2$ and the like, and nitrides such as AlN, $Si_3N_4$, BN, and the like. The first and second ceramic layers 10, 20 may be comprised of the same kind of ceramic material, or different ceramic materials.

According to the present invention, the composite heat-dissipation substrate includes a metal layer 30.

In the present invention, the metal layer 30 is infiltrated into pores 21 in the second porous ceramic layer 20 to be coupled to the ceramic layers.

With this configuration, the metal layer 30 is coupled to the first ceramic layer 10 via the second ceramic layer 20, and has a very efficient structure that can directly absorb heat emitted from the first and second ceramic layers and discharge the heat to the outside.

To maximize heat dissipation, the metal layer 30 may be comprised of a metal having a thermal conductivity of 50 W/m·K or more.

If the thermal conductivity of the metal layer 30 is below this range, it is difficult to achieve sufficient dissipation of heat generated from the light emitting device. In particular, a high output LED requiring a large amount of electric current for operation can undergo deterioration in luminous efficacy and lifespan due to increase in temperature. On the other hand, although the present invention does not define an upper limit of thermal conductivity of the metallic material, the use of a metallic material having an excessively high thermal conductivity can provide a problem of excessive increase of material costs.

Although there is no particular limitation as to the metallic material for the metal layer 30, the metal layer 30 may include at least one selected from Al, Al alloys, Mg, Mg alloys, Cu, and Cu alloys.

The composite heat-dissipation substrate including the first ceramic layer 10, the second ceramic layer 20 and the metal layer 30 has excellent interfacial coupling force between the ceramic layers 10, 20 and the metal layer 30, thereby providing remarkably improved heat dissipation.

Method of Manufacturing Composite Heat-Dissipation Substrate

A method for manufacturing a composite heat-dissipation substrate according to one embodiment of the present invention includes: i) preparing a first ceramic powder having insulating properties; ii) stacking a powder mixture of a second ceramic powder and a pore forming material on the first ceramic powder, iii) forming a porous ceramic structure by evaporating the pore forming material and sintering the first ceramic powder and the powder mixture, iv) squeeze-infiltrating a molten metal into plural pores formed in the porous ceramic structure to be impregnated into the porous ceramic structure.

To manufacture the composite heat-dissipation substrate according to the present invention, i) the first ceramic powder having insulating properties is prepared, and ii) the powder mixture of the second ceramic powder and the pore forming material is placed on the first ceramic powder.

Specifically, as described above, a ceramic powder satisfying the above ranges in terms of thermal conductivity, coefficient of thermal expansion, and insulation resistance is prepared (first ceramic powder).

Then, the powder mixture of the second ceramic powder and the pore forming material is stacked on the first ceramic powder. Here, the second ceramic powder satisfies the above ranges in terms of thermal conductivity, coefficient of thermal expansion, and insulation resistance.

The powder mixture is provided to prepare a porous material having a predetermined range of porosity, which may be adjusted according to particle size of raw powder, molding pressure, sintering conditions, and the like, through sintering.

Next, iii) the porous ceramic structure is formed by evaporating the pore forming material and sintering the first ceramic powder and the powder mixture.

Here, the first ceramic powder becomes a dense ceramic powder by sintering.

Meanwhile, in the powder mixture, the pore forming material is evaporated at a temperature less than or equal to a sintering temperature at which the first ceramic powder and the second ceramic powder are subjected to sintering, so that a space having been occupied by the pore forming material remains after evaporation of the pore forming material. Further, while the second ceramic powder is sintered, the powder mixture becomes a second porous ceramic layer.

Here, the sintering temperature may vary according to the kinds of first and second ceramic powders, and may range from 1000° C. to 1800° C.

Finally, iv) the molten metal is squeeze-infiltrated into pores of the porous ceramic structure to be impregnated into the porous ceramic structure.

In order to infiltrate the molten metal into the pores of the porous ceramic structure, squeeze infiltration may be used. Examples of squeeze infiltration may include liquid pressing, molten forging, die-casting, and the like.

To this end, with the porous ceramic structure loaded in a high pressure container, the molten metal is infiltrated into the pores of the porous ceramic structure at high temperature and high pressure, thereby providing a composite heat-dissipation substrate according to the present invention.

Here, squeeze infiltration may be performed at a temperature 30-200° C. higher than the melting point of the metal and at a pressure of 60 MPa or less.

If squeeze infiltration is performed at a temperature below this range, there is a problem in that the molten metal cannot be infiltrated into the pores due to high viscosity of the molten metal, and if squeeze infiltration is performed at a temperature exceeding this range, there is a problem in that the molten metal reacts with the ceramic layer to form a coarse reactant.

If squeeze infiltration is performed at a pressure exceeding this range, the ceramic layer is subjected to high pressure and thus cannot maintain shape.

In the method of manufacturing the composite heat-dissipation substrate according to the present invention, the first ceramic layer and the second ceramic layer are continuously connected to each other so as not to form an interface therebetween, and the metal layer is infiltrated into pores of the second porous ceramic layer to be coupled to the ceramic layers, whereby the composite heat-dissipation substrate has very high interfacial coupling force between the ceramic layers and the metal layer, thereby remarkably improving heat dissipation characteristics.

Next, the composite heat-dissipation substrate and the method of manufacturing the same according to the present invention will be described in more detail with reference to some examples.

EXAMPLES

Example 1

$Al_2O_3$ powder and a powder mixture of $Al_2O_3$ powder and graphite (20 wt % graphite) were prepared. The powder mixture of $Al_2O_3$ powder and graphite was stacked on the $Al_2O_3$. Then, the graphite was evaporated and the powder mixture of $Al_2O_3$ powder and graphite was sintered at 1400° C. to form a porous ceramic structure. Then, a molten Al alloy (A356) was squeeze-infiltrated into pores of the porous ceramic structure at 735° C. and 10 MPa, thereby preparing a composite heat-dissipation substrate.

Example 2

A composite heat-dissipation substrate was prepared in the same manner as in Example 1 except that PMMA was used as the pore forming material, instead of graphite.

Comparative Example 1

A composite heat-dissipation substrate was prepared by brazing a porous alumina insulation layer onto an alumina insulation layer and infiltrating a molten Al alloy (A356) into the porous structure.

Comparative Example 2

A composite heat-dissipation substrate was prepared by brazing an Al alloy (A356) having a heat sink structure onto an alumina insulation layer.

Comparative Example 3

A composite heat-dissipation substrate was prepared by paste-bonding an Al alloy (A356) having a heat sink structure onto an alumina insulation layer.

Evaluation

1. Optical Microscopy Analysis (1) Example 1

Optical micrographs of a cross-section of the composite heat-dissipation substrate prepared in Example 1 are shown in FIGS. 2 to 5.

Figure 2:
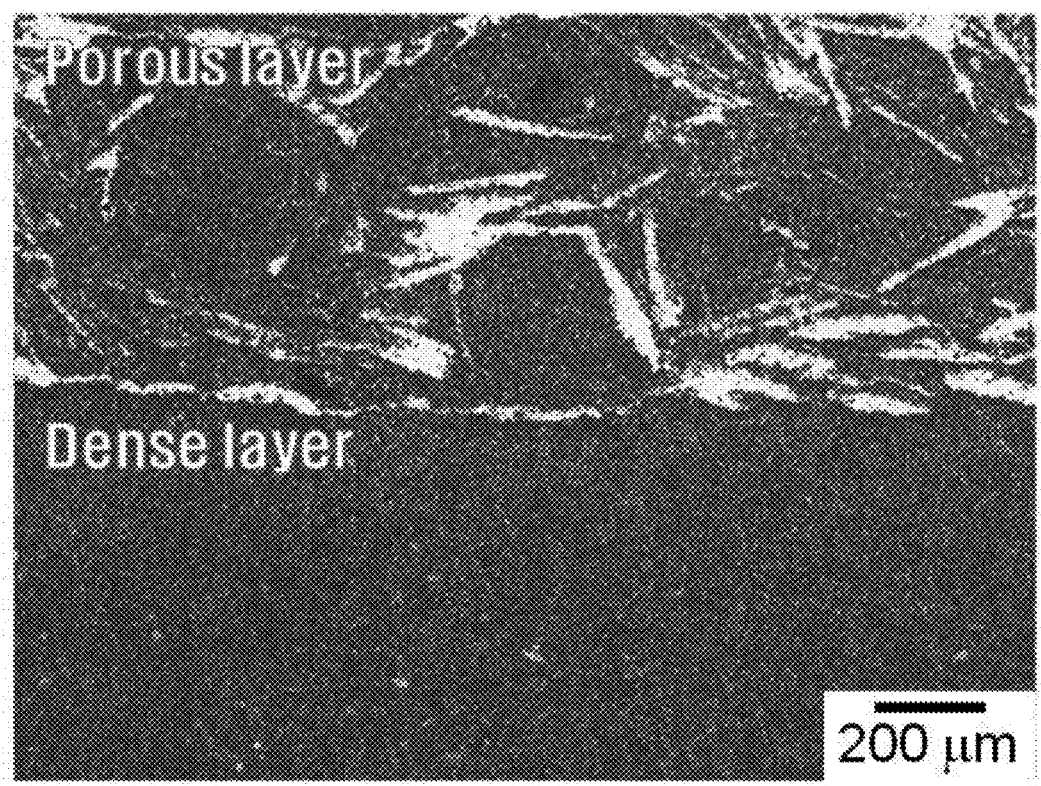
FIGS. 2 to 5 are optical micrographs of a composite heat-dissipation substrate of Example 1.

First, in FIG. 2, it can be seen that the composite heat-dissipation substrate according to this invention includes the first ceramic layer (dense layer) and the second ceramic layer (porous layer) continuously connected to each other so as not to form an interface therebetween.

Figure 3:
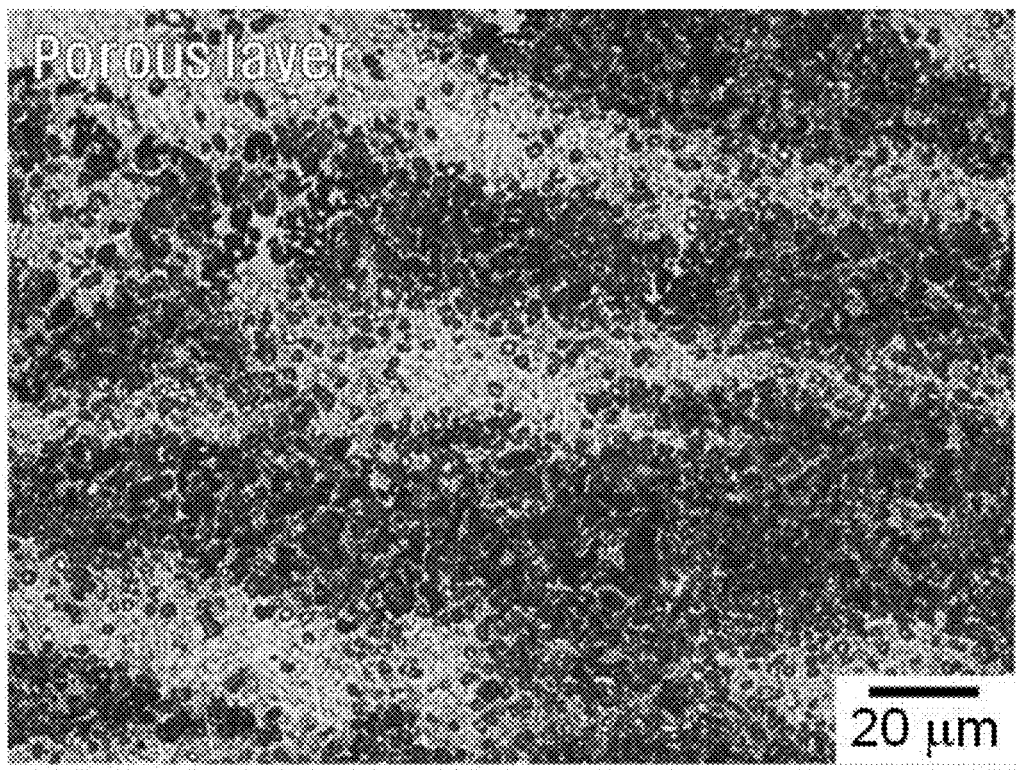
Figure 4:
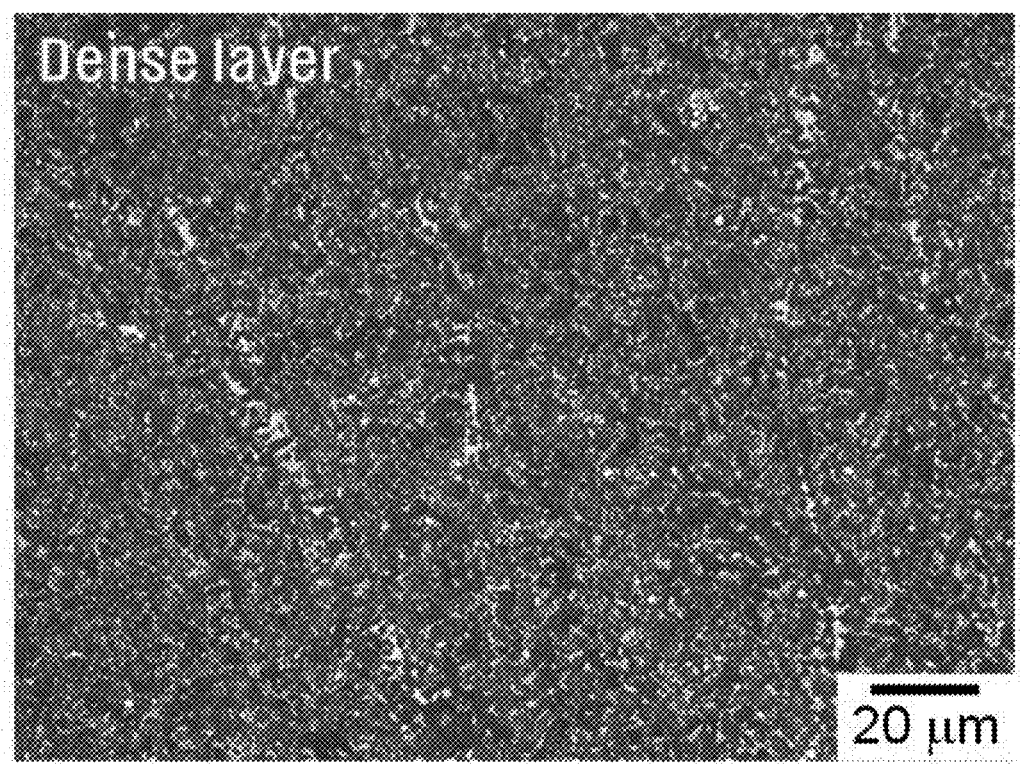

Further, in FIGS. 3 and 4, it can be seen that, in the composite heat-dissipation substrate according to this invention, the second ceramic layer has a porous structure and the first ceramic layer has a dense structure.

Figure 5:
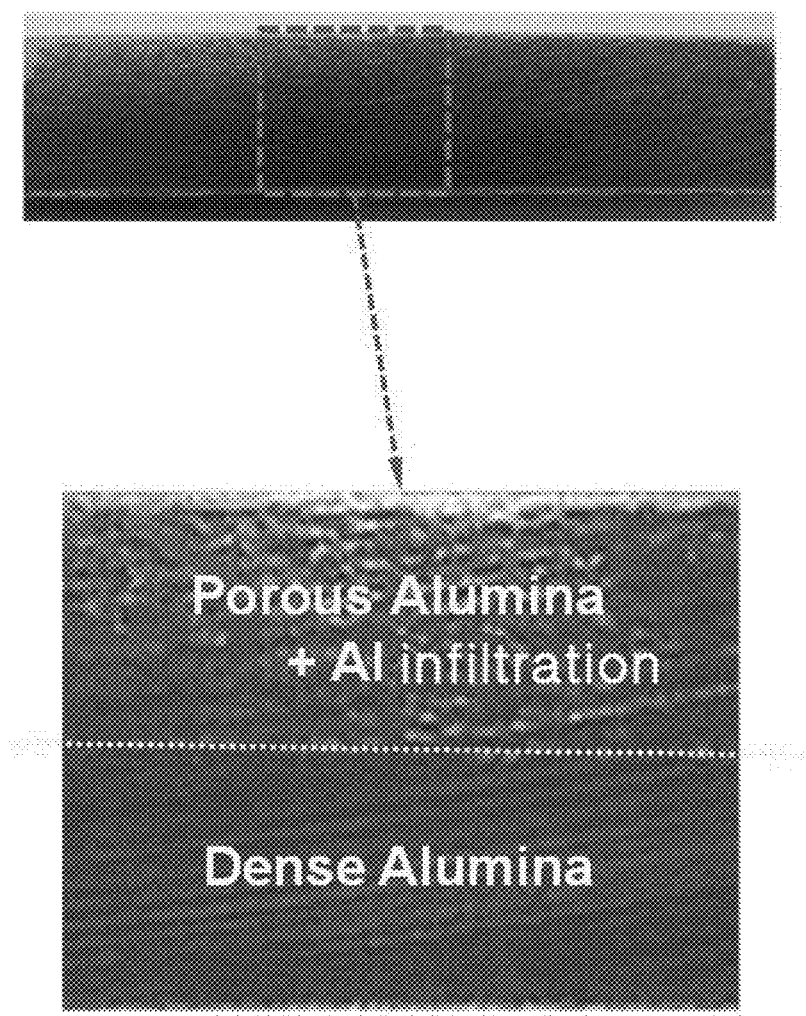

A microstructure of the substrate was observed in order to ascertain infiltration of the metal (Al alloy), and it could be ascertained that the Al alloy was suitably infiltrated into the second porous ceramic layer, as shown in FIG. 5.

(2) Example 2

Optical micrographs of a cross-section of the composite heat-dissipation substrate prepared in Example 2 are shown in FIGS. 6 to 9.

Figure 6:
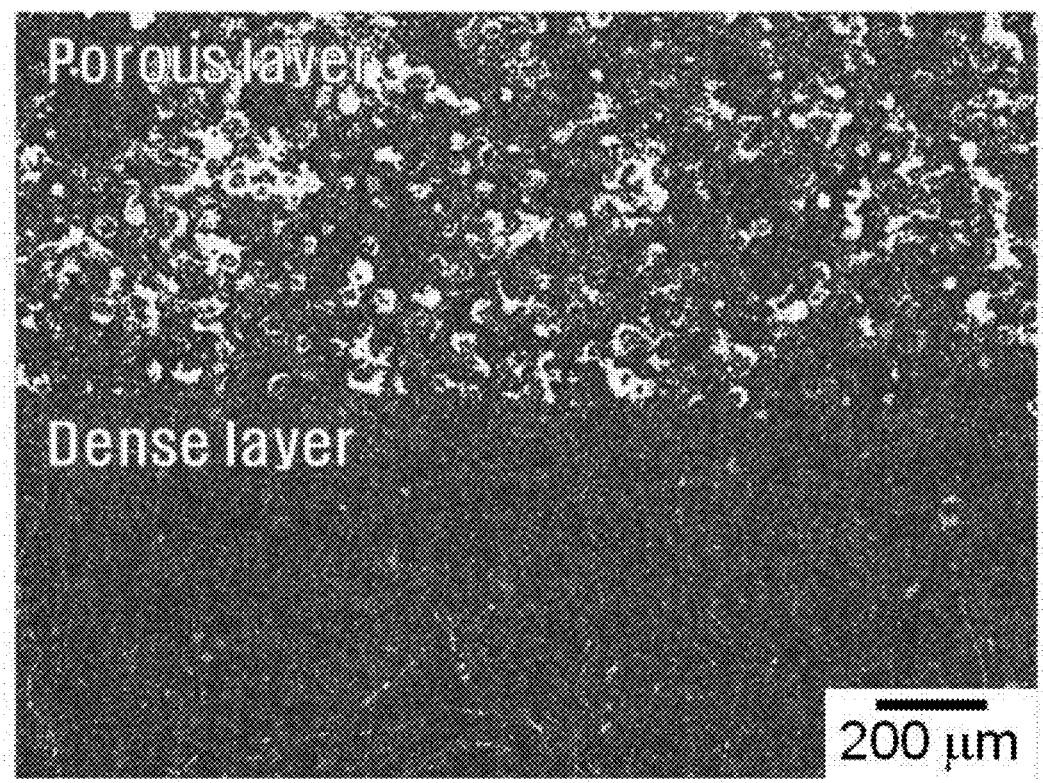
FIGS. 6 to 9 are optical micrographs of a composite heat-dissipation substrate of Example 2.

First, as shown in FIG. 6, it can be seen that the composite heat-dissipation substrate according to this invention includes the first ceramic layer (dense layer) and the second ceramic layer (porous layer) continuously connected to each other so as not to form an interface therebetween.

Figure 7:
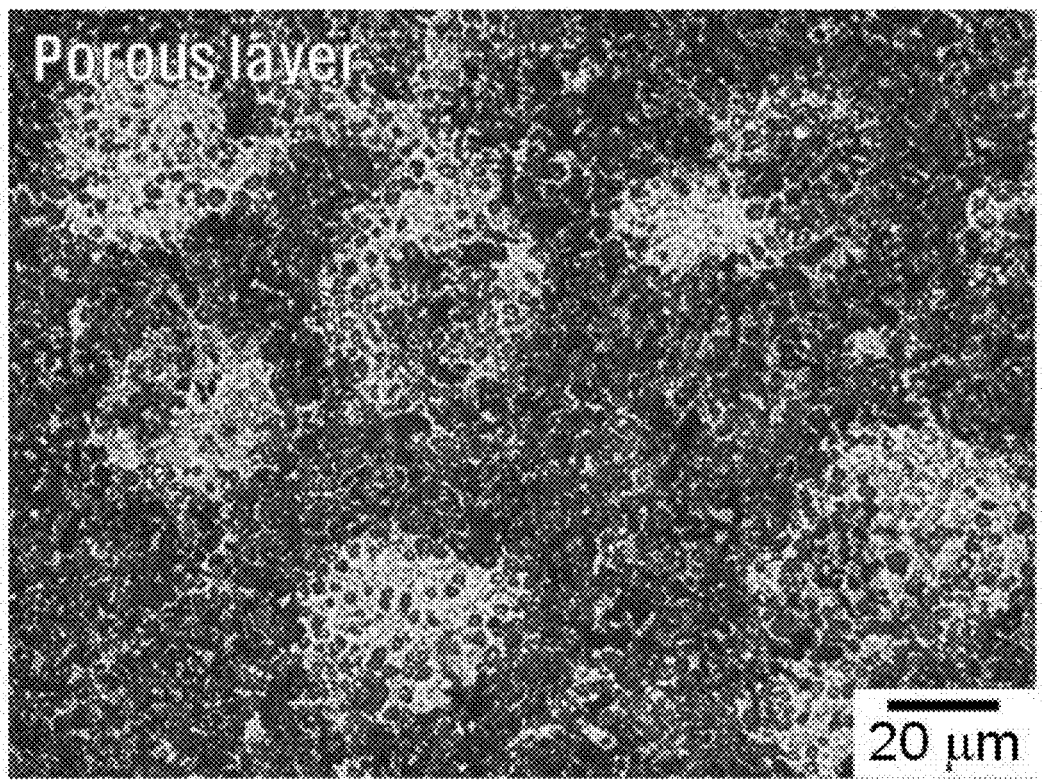
Figure 8:
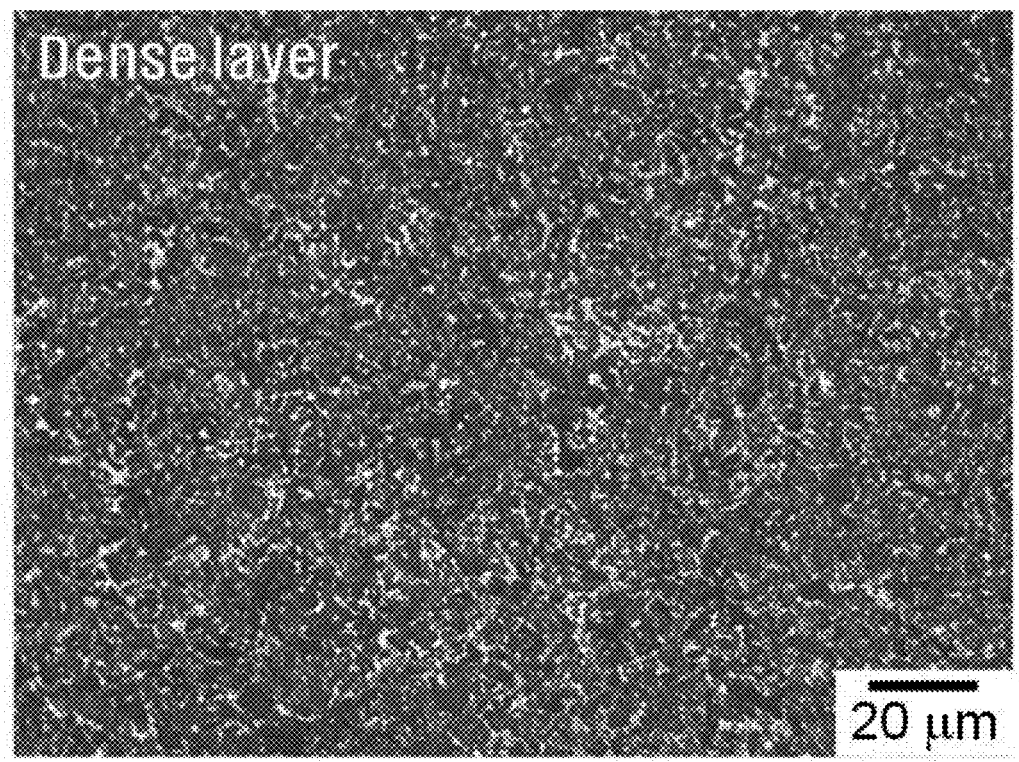

Further, in FIGS. 7 and 8, it can be seen that, in the composite heat-dissipation substrate according to this invention, the second ceramic layer has a porous structure and the first ceramic layer has a dense structure.

Figure 9:
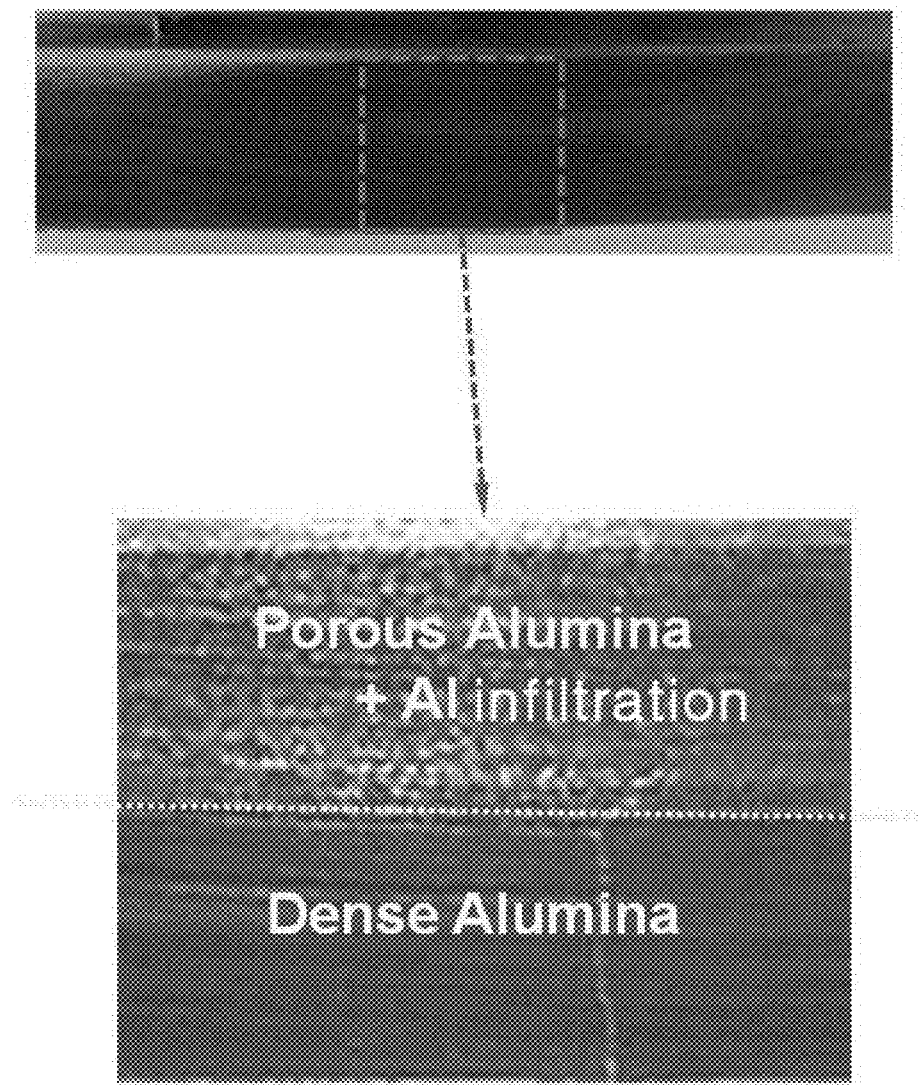

A microstructure of the substrate was observed in order to ascertain infiltration of the metal (Al alloy), and it could be ascertained that the Al alloy was suitably infiltrated into the second porous ceramic layer, as shown in FIG. 9.

2. Property Evaluation

The composite heat-dissipation substrates were evaluated as to physical properties including thermal conductivity. Results are shown in Table 1.

TABLE 1

| | Thickness (mm) | Weight (g) | Density (g/cm3) | Thermal conductivity (cm$^2$/s) | Specific heat (J/gK) | Thermal conductivity (W/mK) |
|---|---|---|---|---|---|---|
| Example 1 | 2.77 | 0.564 | 3.303 | 0.288 | 0.663 | 63.05 |
| Example 2 | 2.79 | 0.566 | 3.369 | 0.265 | 0.521 | 46.52 |
| Comparative Example 1 | 2.78 | 0.568 | 3.301 | 0.198 | 0.531 | 34.71 |
| Comparative Example 2 | 2.76 | 0.564 | 3.296 | 0.186 | 0.493 | 30.22 |
| Comparative Example 3 | 2.82 | 0.564 | 3.332 | 0.153 | 0.509 | 25.95 |

As can be seen from the example and the comparative examples, the composite heat-dissipation substrate according to the present invention has a structure in which the first ceramic layer and the second ceramic layer are continuously connected to each other so as not to form an interface therebetween and the metal layer is infiltrated into pores of the second ceramic layer to provide high interfacial coupling force between the ceramic layers and the metal layer, thereby remarkably improving thermal conductivity and heat transfer efficiency.

Although some embodiments have been described herein, it should be understood by those skilled in the art that these embodiments are given by way of illustration only, and that various modifications, variations and alterations can be made without departing from the spirit and scope of the present invention. Therefore, the scope of the present invention should be limited only by the accompanying claims and equivalents thereof.

What is claimed is:

1. A composite heat-dissipation substrate comprising:
a first ceramic layer having insulating properties;
a second porous ceramic layer; and
a metal layer,
wherein the first ceramic layer and the second ceramic layer are continuously connected to each other so as not to form an interface therebetween, and the metal layer is infiltrated into plural pores of the second ceramic layer to be coupled to the ceramic layers,
wherein the first ceramic layer has a higher density than the second ceramic layer and a density difference between the first ceramic layer and the second ceramic layer ranges from 0.1 g/cm$^3$ to 3 g/cm$^3$.

2. The composite heat-dissipation substrate according to claim 1, wherein the first ceramic layer and the second ceramic layer have a thermal conductivity of 1 W/m·K or more at room temperature.

3. The composite heat-dissipation substrate according to claim 2, wherein the first ceramic layer and the second ceramic layer independently comprise at least one selected from carbides group of SiC and B$_4$C, oxides group of Al$_2$O$_3$, MgO and SiO$_2$, and nitrides group of AlN, Si$_3$N$_4$ and BN.

4. The composite heat-dissipation substrate according to claim 1, wherein the first ceramic layer and the second ceramic layer comprise a ceramic material having a coefficient of thermal expansion of $12 \times 10^{-6}$ or less and an insulation resistance of $10^5$ Ωcm or more.

5. The composite heat-dissipation substrate according to claim 1, wherein the metal layer comprises a metal having a thermal conductivity of 50 W/m·K or more at room temperature.

6. The composite heat-dissipation substrate according to claim 5, wherein the metal comprises at least one selected from Al, Al alloys, Mg, Mg alloys, Cu and Cu alloys.

7. A composite heat-dissipation substrate comprising:
a first ceramic layer having insulating properties;
a second porous ceramic layer; and
a metal layer,
wherein the first ceramic layer and the second ceramic layer are continuously connected to each other so as not to form an interface therebetween, and the metal layer is infiltrated into plural pores of the second ceramic layer to be coupled to the ceramic layers,
wherein the first ceramic layer has a higher density than the second ceramic layer.

8. The composite heat-dissipation substrate according to claim 7, wherein a density difference between the first ceramic layer and the second ceramic layer ranges from 0.1 g/cm$^3$ to 3 g/cm$^3$.

9. The composite heat-dissipation substrate according to claim 7, wherein the first ceramic layer and the second ceramic layer have a thermal conductivity of 1 W/m·K or more at room temperature.

10. The composite heat-dissipation substrate according to claim 1, wherein the first ceramic layer and the second ceramic layer comprise a ceramic material having a coefficient of thermal expansion of $12 \times 10^{-6}$ or less and an insulation resistance of $10^5$ Ωcm or more.

11. The composite heat-dissipation substrate according to claim 9, wherein the first ceramic layer and the second ceramic layer independently comprise at least one selected from carbides group of SiC and B$_4$C, oxides group of Al$_2$O$_3$, MgO and SiO$_2$, and nitrides group of AlN, Si$_3$N$_4$ and BN.

12. The composite heat-dissipation substrate according to claim 7, wherein the metal layer comprises a metal having a thermal conductivity of 50 W/m·K or more at room temperature.

13. The composite heat-dissipation substrate according to claim 12, wherein the metal comprises at least one selected from Al, Al alloys, Mg, Mg alloys, Cu and Cu alloys.

* * * * *